(12) United States Patent
Sewell

(10) Patent No.: US 9,722,103 B2
(45) Date of Patent: Aug. 1, 2017

(54) THERMAL COMPRESSION BONDING APPROACHES FOR FOIL-BASED METALLIZATION OF SOLAR CELLS

(71) Applicant: Richard Hamilton Sewell, Los Altos, CA (US)

(72) Inventor: Richard Hamilton Sewell, Los Altos, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/752,830

(22) Filed: Jun. 26, 2015

(65) Prior Publication Data

US 2016/0380128 A1    Dec. 29, 2016

(51) Int. Cl.
| | |
|---|---|
| *H01L 21/00* | (2006.01) |
| *H01L 31/0224* | (2006.01) |
| *H01L 31/18* | (2006.01) |
| *H01L 31/05* | (2014.01) |

(52) U.S. Cl.
CPC ...... *H01L 31/022425* (2013.01); *H01L 31/18* (2013.01); *H01L 31/022441* (2013.01); *H01L 31/0516* (2013.01); *Y02E 10/50* (2013.01); *Y02P 70/521* (2015.11)

(58) Field of Classification Search
CPC .............. H01L 31/022425; H01L 31/18
USPC ........................................................... 438/98
See application file for complete search history.

(56) References Cited

U.S. PATENT DOCUMENTS

| | | | |
|---|---|---|---|
| 5,028,546 A | * | 7/1991 | Hotchkiss ......... H01L 31/02242 136/250 |
| 2008/0216887 A1 | | 9/2008 | Hacke et al. |
| 2009/0071588 A1 | | 3/2009 | Kimura et al. |
| 2012/0204938 A1 | | 8/2012 | Hacke et al. |
| 2013/0000715 A1 | * | 1/2013 | Moslehi ............ H01L 31/02244 136/256 |
| 2013/0102475 A1 | | 4/2013 | Blue et al. |
| 2013/0143353 A1 | * | 6/2013 | Ramappa .......... H01L 31/02244 438/98 |
| 2015/0090329 A1 | * | 4/2015 | Pass .................. H01L 31/02244 136/256 |
| 2016/0087119 A1 | * | 3/2016 | Pass ........................ H01L 31/18 438/98 |

FOREIGN PATENT DOCUMENTS

| | | |
|---|---|---|
| DE | 10020412 | 11/2001 |
| WO | WO-2012012809 | 9/2012 |
| WO | WO-2012165583 | 12/2012 |

OTHER PUBLICATIONS

U.S. Appl. No. 62/052,372, filed Sep. 18, 2014, 45 pages.
International Search Report and Written Opinion for PCT Patent Application No. PCT/US16/39110 mailed Oct. 5, 2016, 15 pgs.

* cited by examiner

*Primary Examiner* — Tod T Van Roy
*Assistant Examiner* — Vu A Vu
(74) *Attorney, Agent, or Firm* — Blakely Sokoloff Taylor Zafman LLP

(57) ABSTRACT

Thermal compression bonding approaches for foil-based metallization of solar cells, and the resulting solar cells, are described. For example, a method of fabricating a solar cell includes placing a metal foil over a metalized surface of a wafer of the solar cell. The method also includes locating the metal foil with the metalized surface of the wafer. The method also includes, subsequent to the locating, applying a force to the metal foil such that a shear force appears between the metal foil and the metallized surface of the wafer to electrically connect a substantial portion of the metal foil with the metalized surface of the wafer.

20 Claims, 11 Drawing Sheets

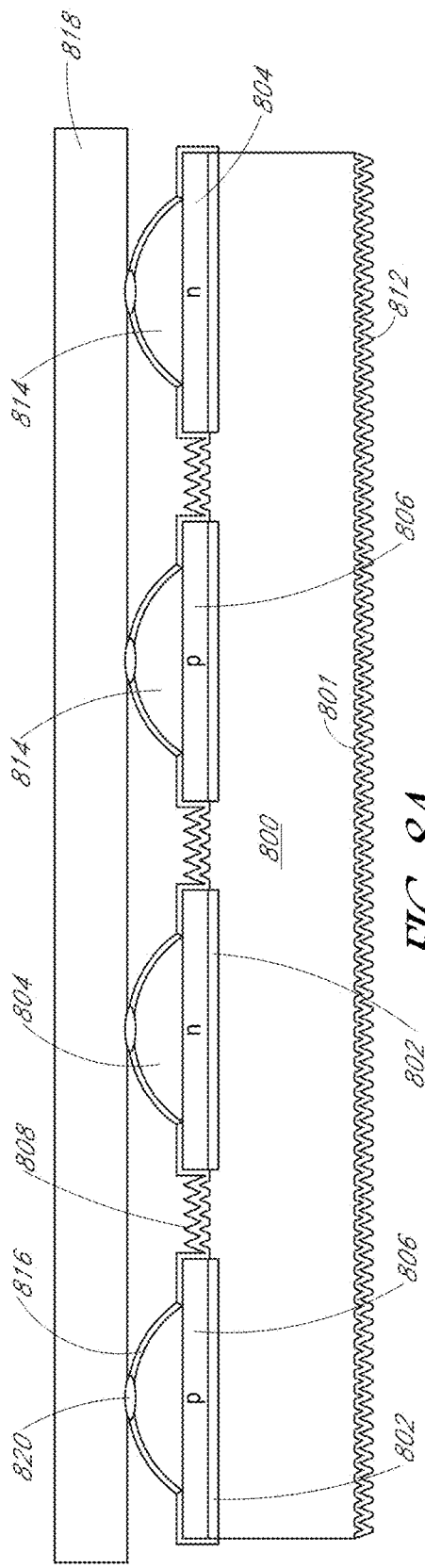
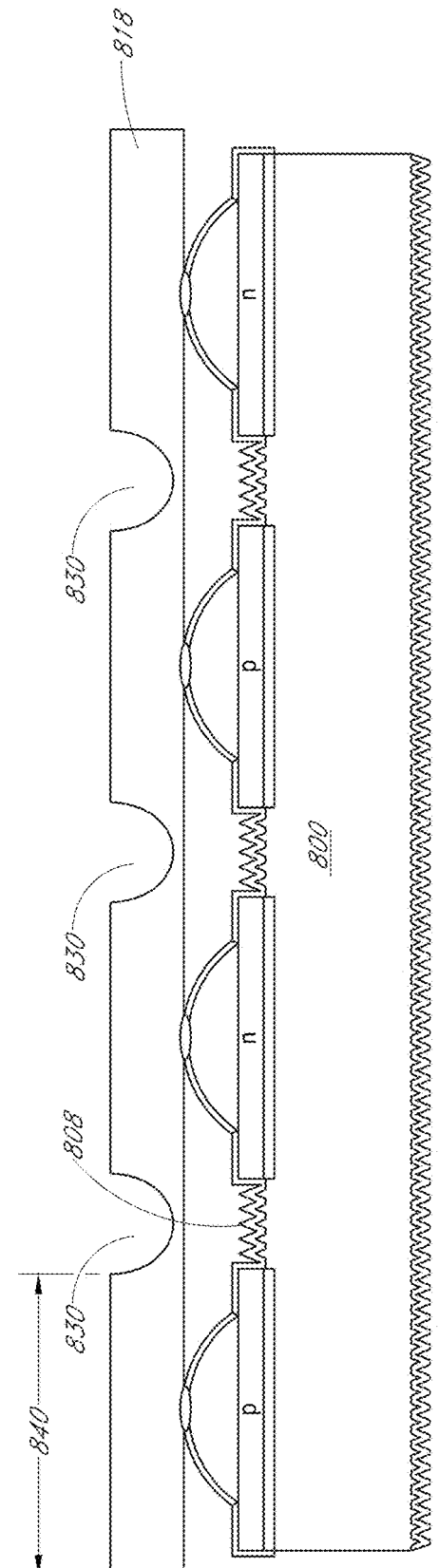
FIG. 8A
FIG. 8B

THERMAL COMPRESSION BONDING APPROACHES FOR FOIL-BASED METALLIZATION OF SOLAR CELLS

TECHNICAL FIELD

Embodiments of the present disclosure are in the field of renewable energy and, in particular, include approaches for foil-based metallization of solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 8A-8C illustrate cross-sectional views of various stages in the fabrication of a solar cell using foil-based metallization, in accordance with an embodiment of the present disclosure.

DETAILED DESCRIPTION

Figure 1:
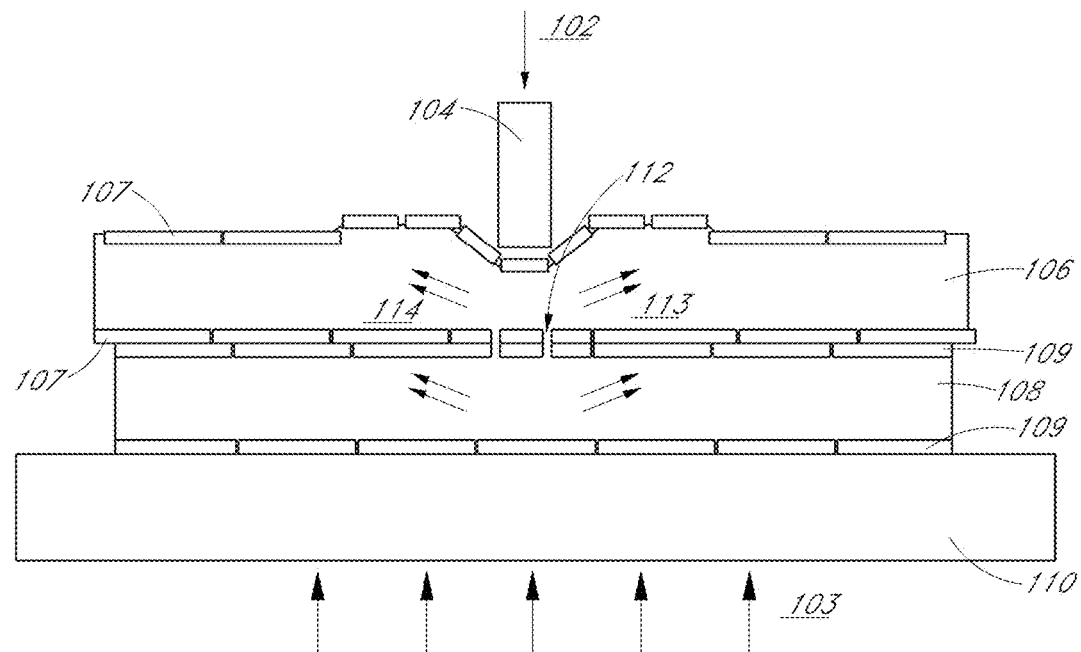
FIG. 1 illustrates application of first point pressure, for improved thermo-compression bonding, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

TERMINOLOGY

The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Thermal compression bonding approaches for foil-based metallization of solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell includes placing a metal foil over a metalized surface of a wafer of the solar cell. The method also includes locating the metal foil with the metalized surface of the wafer. The method also includes, subsequent to the locating, applying a force to the metal foil such that a shear force appears between the metal foil and the metallized surface of the wafer to electrically connect a substantial portion of the metal foil with the metalized surface of the wafer.

In another embodiment, a method of fabricating a solar cell includes placing a metal foil over a surface of a wafer of the solar cell including exposed alternating N-type and P-type semiconductor regions. The method also includes locating the metal foil with the exposed alternating N-type and P-type semiconductor regions of the wafer. The method also includes, subsequent to the locating, applying a force to the metal foil such that a shear force appears between the metal foil and the alternating N-type and P-type semiconductor regions of the wafer to electrically connect a substantial portion of the metal foil with the alternating N-type and P-type semiconductor regions of the wafer.

In another embodiment, a method of fabricating a solar cell includes placing a metal foil over a surface of a wafer of the solar cell. The method also includes locating the metal foil with the surface of the wafer by forming a plurality of spot welds between the metal foil and the surface of the wafer by performing a tacking process while heating the wafer of the solar cell to a temperature approximately in the range of 350-580 degrees. The method also includes, subsequent to the locating, applying a force to the metal foil such that a shear force appears between the metal foil and the surface of the wafer to electrically connect a substantial portion of the metal foil with the surface of the wafer while heating the wafer of the solar cell to a temperature approximately in the range of 350-580 degrees Celsius.

One or more embodiments described herein provides a technique for thermo-compression bonding of a metal foil (such as an aluminum foil) to a solar cell. In an embodiment, the metal foil is allowed or caused to flow or stretch away from a bonding interface. As the metal foil is stretched, an existing surface oxide cracks apart to reveal un-reacted metal (e.g., a fresh aluminum surface) which will readily bond with features of the solar cell.

To provide context, the general method of aluminum foil bonding by thermo-compression enables a low cost cell metallization without plating. However, thermo-compression bonding has associated challenges with respect to addressing how to apply and bond an aluminum foil to a cell in a manner that provides have good adhesion and uniformity. In state-of-the-art thermo-compression approaches, a metal foil is placed on the wafer and bonded using a graphite paddle in a shear motion. One potential issue associated with the state-of-the-art approach is the significant thermal expansion of the foil as it comes into contact with the solar cell wafer. Such thermal expansion can lead to a buckling of the metal foil which then creates folds and wrinkles in the bonded foil. A further potential issue is that the metal foil may not be at sufficient temperature for bonding until it has been held against the wafer of the solar cell for some period of time. In the case that the foil does not bond to the wafer in an area during the swipe, trapped air pockets or blisters may form. Finally, the non-uniform buckling and movement of the metal foil during the swipe can render the process difficult to automate.

Addressing one or more of the above issues, in accordance with an embodiment of the present disclosure, a first operation of a bonding approach involves formation of an array of point or spot bonds across the bonding surface of the wafer of the solar cell. Alternatively, such array of point or spot bonding may be effected using laser welding. In the thermo-compression case, the thermo-compression bond may be made using a bed of nails type tooling or a porcupine roller type of tooling, as are described in greater detail below. The array of point or spot bonds may be fabricated in one press, or in a series of presses. The array of point or spot bonds can provide good adhesion to the underlying solar cell wafer. Furthermore, the first operation allows for remainder of the metal foil to heat up to the bonding temperature. In an embodiment, by performing a first operation involving the formation of the array of point or spot bonds, trapping air amongst the array of point or spot bonds can be inhibited. The gaps between the point or spot bonds in the array enable air to be pushed out or evacuated before or during the a subsequent bonding operation.

A second, subsequent, operation of the bonding approach involves implementation of a shear process to bond the metal foil to the wafer of the solar cell at regions or locations between the point or spot bonds. The second operation may be performed, e.g., by pressing a graphite puck into the metal foil over the center of the wafer and moving it toward the outside of the wafer in a spiral motion so as to expel the air from between the foil and the wafer, while still pressing the puck downwards on the metal foil. In another approach, a set of graphite paddles or squeegees are used to bond down the metal foil. One possible sequence is to use two paddles to swipe left and right from the center to bond a center strip, followed by up and down motions from the center strip to complete the bonding. It is to be appreciated that other swipe sequences may also be suitable. In one embodiment, a vacuum fixture is implemented to evacuate the air from between the metal foil and the wafer after point or spot bonding.

More specifically, the above described thermo-compression approaches may be performed to provide thermo-compression bonding of an aluminum (or other metal) foil to a sputtered metal seed layer on a wafer or directly to the wafer. As alluded to above, state-of-the-art approaches have issues associated with wrinkling of metal foil during a swipe process and, possibly, with the trapping of air bubbles. It is recognized that a parallel plate press of a metal foil onto the wafer does not lead to bonding. Instead, although not to be bound by theory, in accordance with one or more embodiments described herein, application of first point pressure and then shear pressure provides for improved thermo-compression bonding. This approach allows the foil to locally stretch at the interface, in some instances breaking a passivating oxide and allowing the metal foil to "stick" to the underlying wafer. By contrast, again not to be bound by theory, it is understood that state-of-the-art parallel plate pressure does not enable bonding since there is no force available to crack the surface oxides.

Figure 2A:
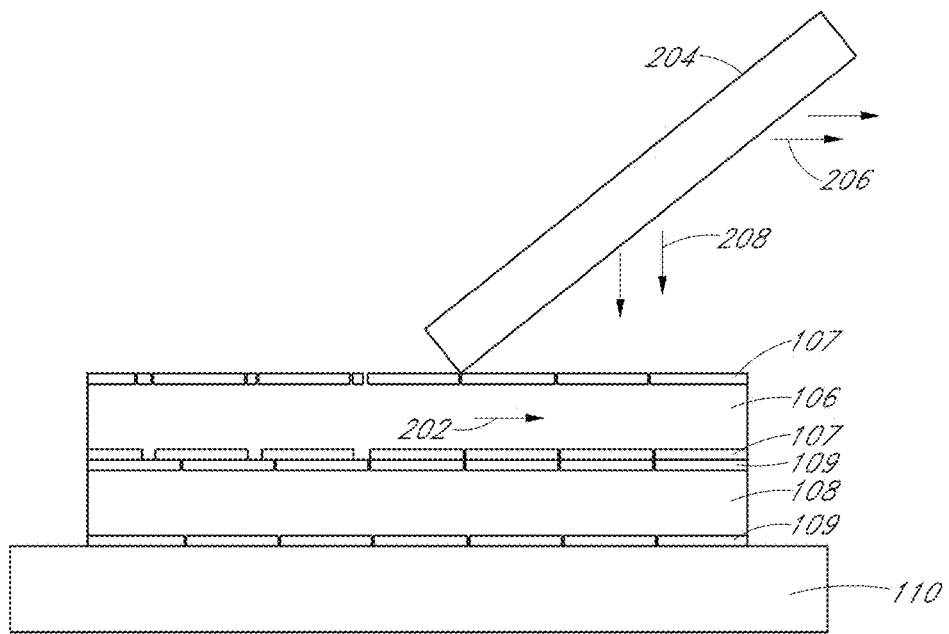
FIG. 2A illustrates subsequent application of shear pressure for improved thermo-compression bonding, in accordance with an embodiment of the present disclosure.

To aid with understanding the concepts described above, FIG. 1 illustrates application of first point pressure, while FIG. 2A illustrates subsequent application of shear pressure, for improved thermo-compression bonding, in accordance with an embodiment of the present disclosure.

Referring to FIG. 1, point pressure in direction 102 against direction 103 is provided by applying local pressure by device 104 to a metal foil 106 disposed above a metallized portion 108 of a wafer 110 of a solar cell. In an embodiment, the metal foil 106 is an aluminum foil having oxide surface layers 107. In a specific such embodiment, metallized portion 108 of the solar cell is an aluminum seed layer having oxide surface layers 109. The point pressure from direction 102 stretches the metal foil 106 and breaks the oxide surface layer 107 at locations such as location 112 when the metal foil is locally stretched in directions 113 and 114. It is to be appreciated that the metallized portion 108 of the wafer 110 of the solar cell may also undergo local stretching, as is depicted by the arrows in FIG. 1.

Referring to FIG. 2A, a shear force is applied along direction 202 of metal foil 106. The shear force may be particularly effective for regions of the metal foil 106 that were not bonded to the metallization layer 108 during the point force application described in association with FIG. 1. As the shear force is applied along direction 202, the metal foil 106 is stretched and the oxide surface layers breaks to allow for direct metal to metal thermo-compression bonding. In an embodiment, the shear force is applied by dragging a graphite paddle 204 along direction 206, while pressure is applied downward along direction 208.

Figure 2B:
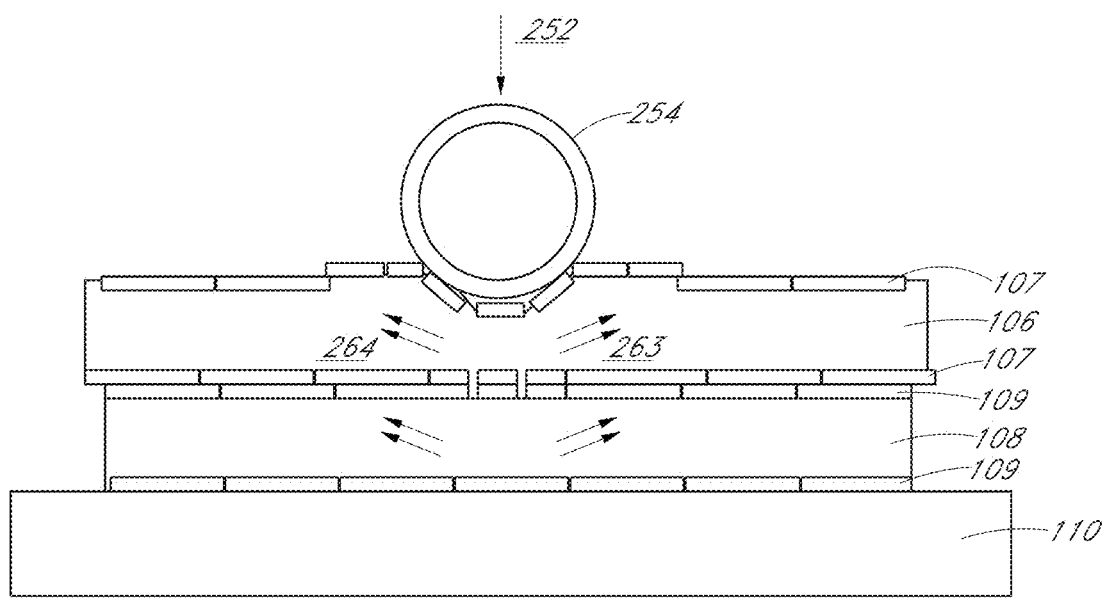
FIG. 2B illustrates application of a roller for improved thermo-compression bonding, in accordance with an embodiment of the present disclosure.

In another embodiment, the force is applied to the metal foil 106 by rolling a roller across a top surface of the metal foil 106. FIG. 2B illustrates application of a roller 252 for improved thermo-compression bonding. In this case, the roller 252 may not actually apply a shear force directly to the metal foil 106, but rather may apply a normal force to the foil 106 with a shearing effect occurring as the rolling process is performed along the surface of the metal foil 106.

Referring to FIG. 2B, normal pressure in direction 252 is provided by applying roller 252 to the metal foil 106 disposed above the metallized portion 108 of the wafer 110 of the solar cell. In an embodiment, the metal foil 106 is an aluminum foil having oxide surface layers 107. In a specific such embodiment, metallized portion 108 of the solar cell is an aluminum seed layer having oxide surface layers 109. The normal pressure from direction 252 stretches the metal foil 106 and breaks the oxide surface layer 107 at some locations when the metal foil 106 is locally stretched in directions 263 and 264. It is to be appreciated that the metallized portion 108 of the wafer 110 of the solar cell may also undergo local stretching, as is depicted by the arrows in FIG. 2B. Then, as the roller 252 is rolled along the surface, a shearing effect occurs as the rolling process is performed along the surface of the metal foil 106.

Figure 3:
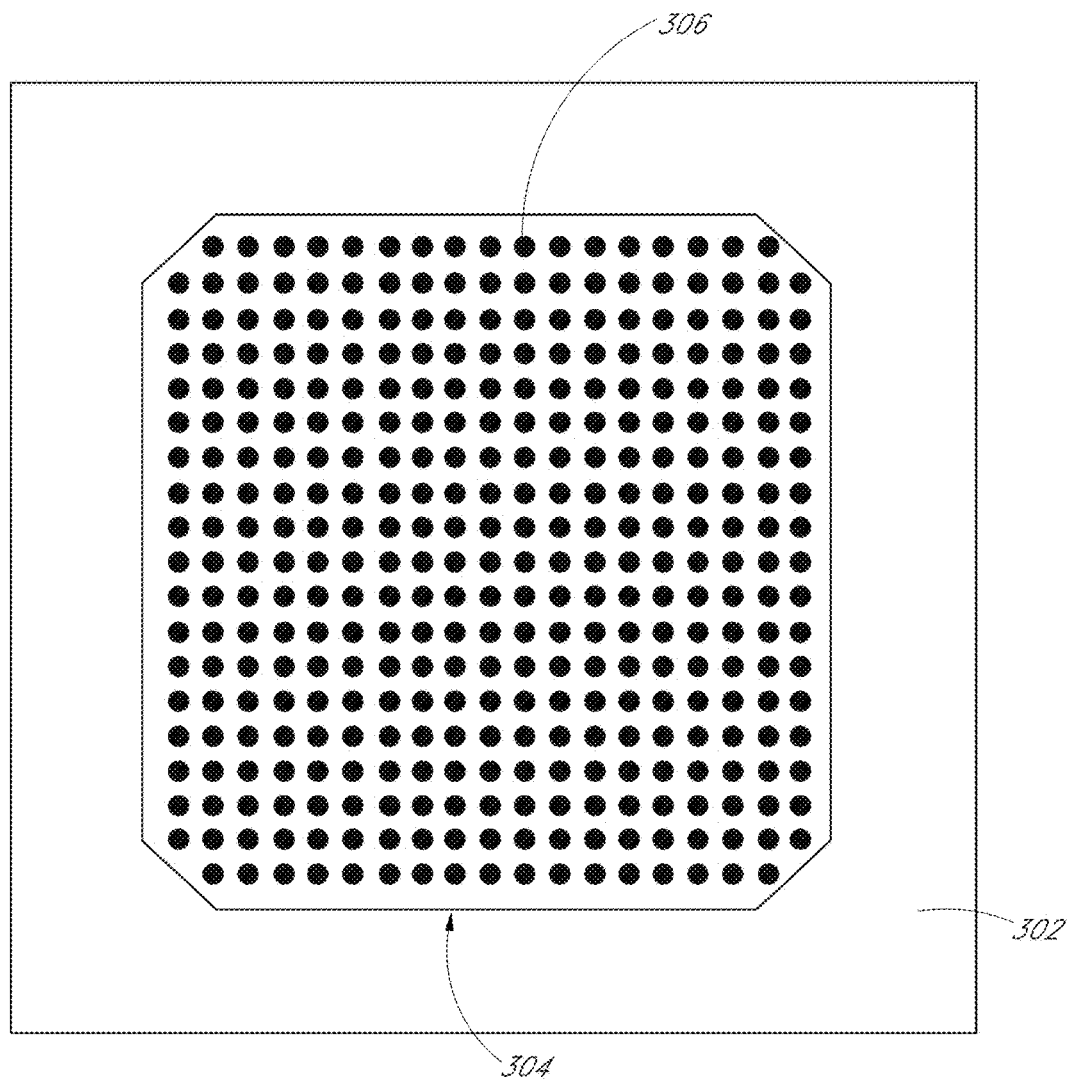
FIG. 3 illustrates a plan view from above an illustratively transparent metal foil to highlight an array of point or spot bonds between the metal foil and a wafer of a solar cell, in accordance with an embodiment of the present disclosure.

With respect to the initial operation for a thermo-compression bonding approach, FIG. 3 illustrates a plan view from above an illustratively transparent metal foil to highlight an array of point or spot bonds between the metal foil and a wafer of a solar cell, in accordance with an embodiment of the present disclosure. Referring to FIG. 3, a metal foil 302 is disposed above a wafer 304 of a solar cell. The metal foil is made to be transparent in FIG. 3 for illustrative purposes. This allows visualization of an array of point or spot welds 306 that directly bond the metal foil 302 to a surface of the wafer 304. In an embodiment, the array of point or spot welds 306 is formed by a thermo-compression bonding process, such as described in association with FIG. 1. In other embodiments, the array of point or spot welds 306 is formed by a laser welding process. In the case that a thermo-compression bonding process is used, a tacking approach may be implemented. In an embodiment, tacking provides the metal foil 302 as tacked to the wafer 304 in multiple locations.

Figure 4A:
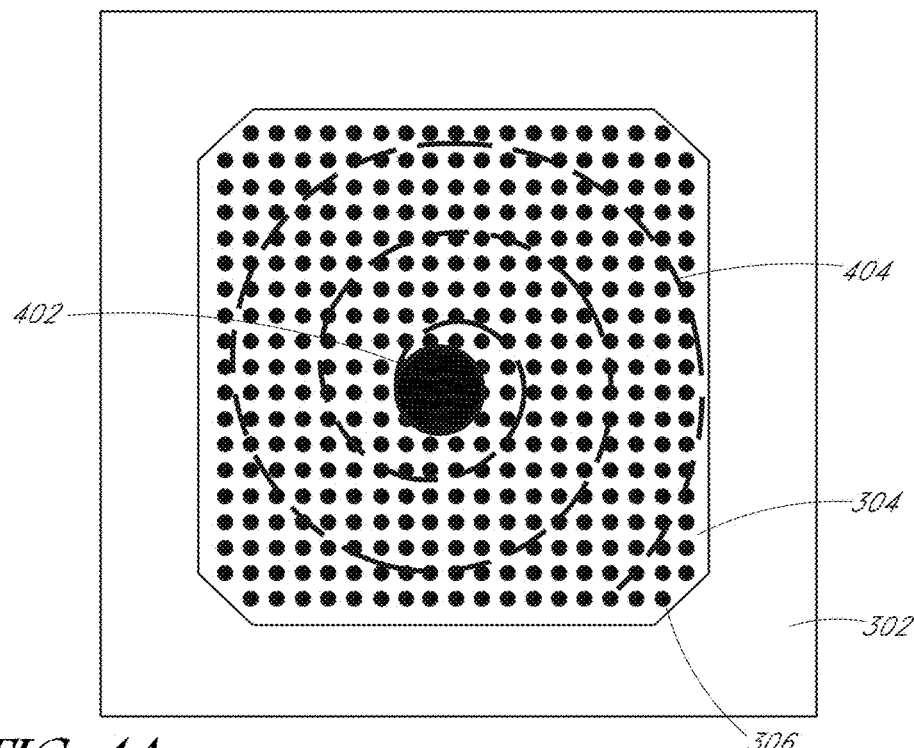
FIG. 4A illustrates an option for a second operation in a thermo-compression bonding approach, in accordance with an embodiment of the present disclosure.

As mentioned briefly above and as now illustrated in FIG. 4A, in an embodiment, the second operation in a thermo-compression bonding approach is performed by pressing a graphite puck or paddle 402 into the metal foil 302 of the arrangement of FIG. 3. The graphite puck or paddle 402 is pressed into the metal foil 302 over the center of the wafer 304 and is moved toward the outside of the wafer 304 in a spiral motion 404 while still pressing the puck or paddle 402 downwards on the metal foil 302. In this way, air may be expelled from between the metal foil 302 and the wafer 304.

Figure 4B:
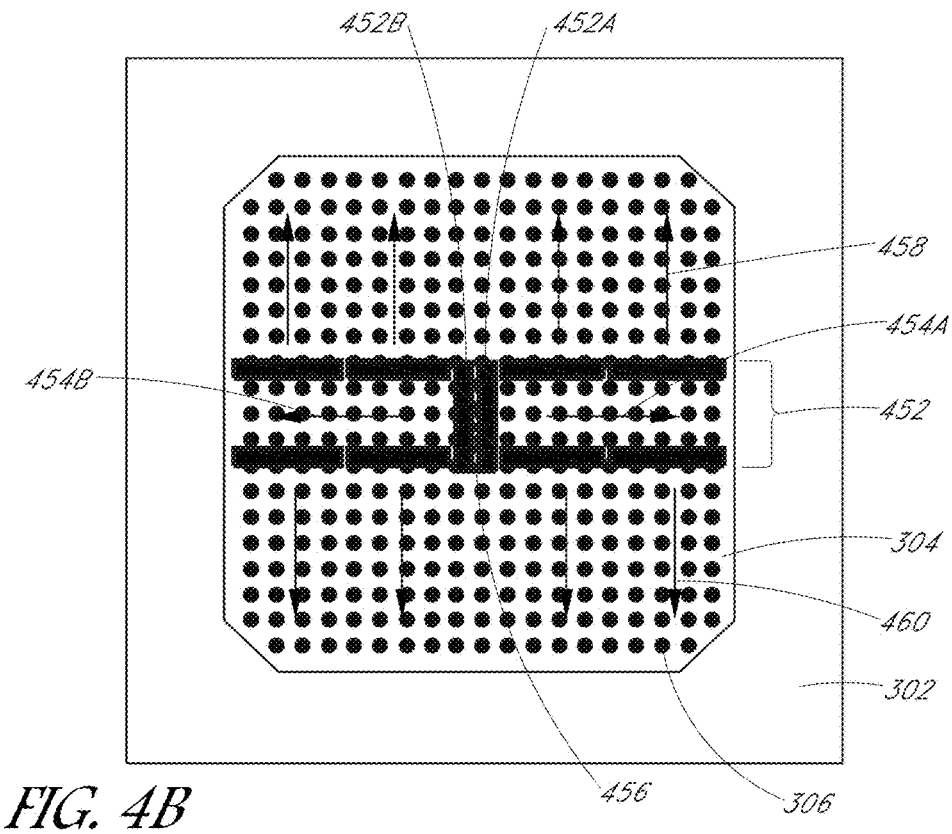
FIG. 4B illustrates another option for a second operation in a thermo-compression bonding approach, in accordance with another embodiment of the present disclosure.

As is also mentioned briefly above and now illustrated in FIG. 4B, in an embodiment, the second operation in a thermo-compression bonding approach is performed by using a set of graphite paddles or squeegees 452 to bond down the metal foil 302 of the arrangement of FIG. 3. In one specific embodiment, two paddles 452A and 452B are used to swipe left (452B) along arrow 454B and right (452A) along arrow 454A from the center 456 to bond a center strip. Subsequently, up motions 458 and down motions 468 are effected from the center strip to complete the bonding.

Referring to both FIGS. 4A and 4B, in an embodiment, a vacuum fixture is implemented to evacuate the air from between the metal foil 302 and the wafer 304 after point or spot bonding. Additionally, with reference to both FIGS. 4A and 4B, in an embodiment, point or spot bonding 306 constrains expansion of the metal foil 302 so that folds and wrinkles do not form during the swipe process. Additionally, in an embodiment, the first operation point or spot bonding transfers heat into the metal foil 302 so that the metal foil 302 bonds immediately to the surface of the wafer 304 when pressed in the swipe process.

Figure 5A:
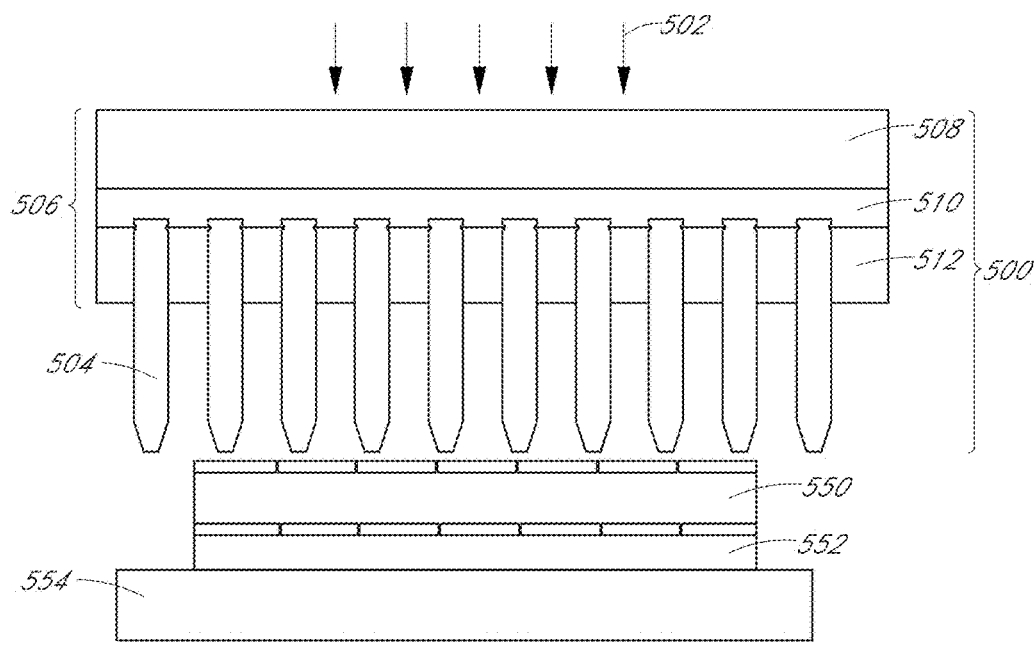
FIG. 5A illustrates a cross-sectional view of a bed of nails tool suitable for a tacking operation of a thermo-compression bonding process, in accordance with an embodiment of the present disclosure.

FIG. 5A illustrates a cross-sectional view of a bed of nails tool suitable for a tacking operation of a thermo-compression bonding process, in accordance with an embodiment of the present disclosure. Referring to FIG. 5A, a bed of nails tool 500 is pressed downward 502 into a metal foil 550 (which may include surface oxide layers 551) above a surface or layer 552 of a wafer 554. The bed of nails tool 500 includes nails or spikes or pins 504 supported by a holder 506. The holder 506 may include a back plate 508 held together with an elastomer layer 510 to a front plate 512 in which the nails or spikes or pins 504 are embedded. In an embodiment, each pin 504 requires independent suspension to account for slight thickness variations in the metal foil 550. In one embodiment, then, an advantage of the bed of nails approach is that each pin 504 can have independent suspension to allow for slight changes in wafer or foil thickness from point to point.

Figure 5B:
FIG. 5B is an image of porcupine roller tool also suitable for a tacking operation of a thermo-compression bonding process, in accordance with another embodiment of the present disclosure.

FIG. 5B is an image of porcupine roller tool 590 also suitable for a tacking operation of a thermo-compression bonding process, in accordance with another embodiment of the present disclosure. With reference to both FIGS. 5A and 5B, tacking involves applying point pressure to enable the metal foil to flow, exposing a fresh metal (e.g., aluminum) surface for bonding. Furthermore, both tacking approaches (bed of nails or porcupine roller) enables the metal foil to absorb heat from the, while maintaining a route for air to escape from between weld points.

Figure 6:
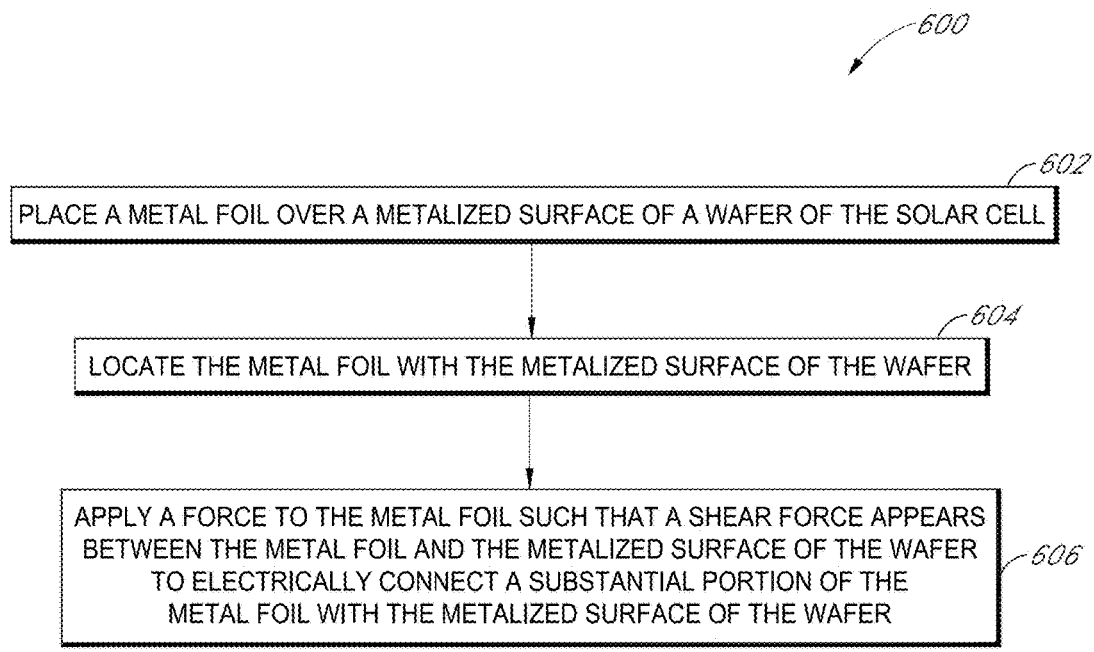
FIG. 6 is a flowchart listing operations in a method of fabricating a solar cell, in accordance with an embodiment of the present disclosure.
Figure 7A:
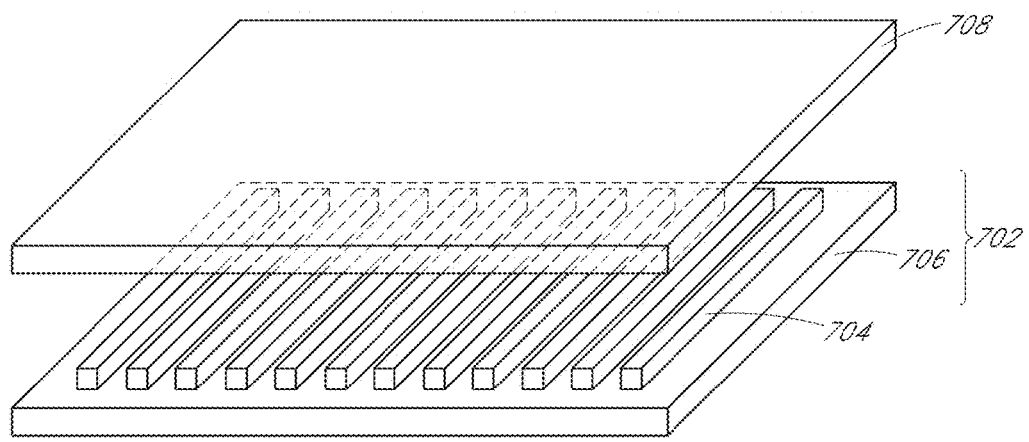
FIGS. 7A and 7B illustrate angled views of various stages in the fabrication of a solar cell using foil-based metallization, in accordance with an embodiment of the present disclosure.
Figure 7B:
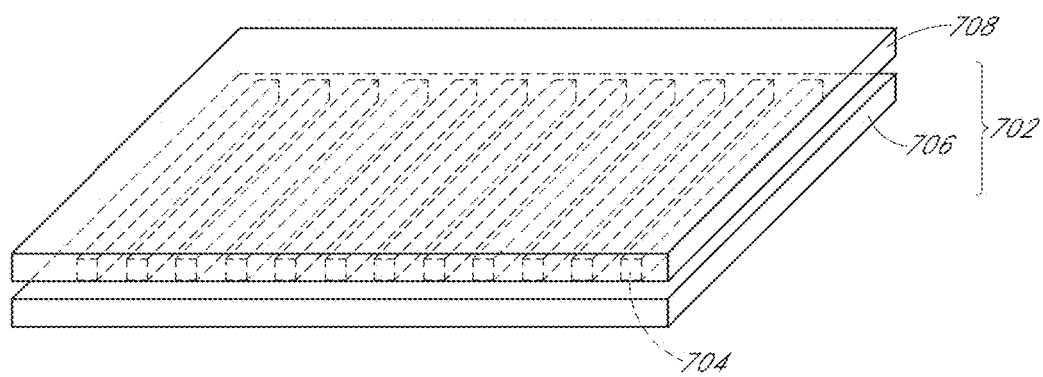

In a first aspect, a metal foil and solar cell pairing approach involving thermo-compression bonding is implemented using a metallized surface of a wafer of the solar cell. Consistent with the first aspect, FIGS. 7A and 7B illustrate angled views of various stages in the fabrication of a solar cell using foil-based metallization. FIG. 6 is a flowchart 600 listing operations in a method of fabricating a solar cell as corresponding to FIGS. 7A and 7B, in accordance with an embodiment of the present disclosure.

Referring to operation 602 of flowchart 600, a method of fabricating a solar cell involves placing a metal foil over a metalized surface of a wafer of the solar cell. Referring to corresponding FIGS. 7A and 7B, a metal foil 708 is placed on a wafer 702 having a plurality of emitter regions 704 (which may include metal seed regions) disposed on or above a substrate 706.

In an embodiment, the metallized surface of the wafer 702 includes alternating N-type and P-type semiconductor regions and a plurality of metal seed material regions on each of the alternating N-type and P-type semiconductor regions, as is described in greater detail below in association with FIGS. 8A-8C. In an embodiment, the metal foil 708 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil.

Referring to operation 604 of flowchart 600, the method further involves locating the metal foil with the metalized surface of the wafer. With reference back to FIG. 3, in an embodiment, the metal foil 708 is located or fit-up with the underlying solar cell 702 by forming a plurality of spot welds between the metal foil 708 and the metalized surface of the wafer using a tacking process. In one such embodiment, the tacking process involves applying a bed of nails or a porcupine roller on the metal foil 708 to form the plurality of spot welds. In one embodiment, the tacking process is performed while heating the wafer 702 of the solar cell to a temperature approximately in the range of 350-580 degrees Celsius during the tacking process. Such a temperature range is sufficiently low to avoid rapid alloying of silicon and aluminum which would typically severely damage the carrier lifetime of the cell. It is to be appreciated, however, that even at lower temperatures, some diffusion of silicon into aluminum layers can occur if the device is held at high temperature for too long.

In an embodiment, implementing the tacking process involves breaking through portions of one or more metal oxide layers at an interface between the metal foil 708 and the metalized surface of the solar cell 702 to form the plurality of spot welds. In an embodiment, the plurality of spot welds provides channels between the metal foil 708 and the metalized surface for subsequent removal of air from between the metal foil 708 and the metalized surface. In another embodiment, instead of a tacking process, locating the metal foil 708 with the metalized surface of the wafer 702 involves forming a plurality of spot welds between the metal foil 708 with the metalized surface of the wafer using a laser welding process.

Referring to operation 606 of flowchart 600, and with reference back to FIGS. 4A and 4B, the method further involves, subsequent to the locating, applying a force to the metal foil 708 such that a shear force appears between the metal foil 708 and the metalized surface of the wafer 702 to electrically connect a substantial portion of the metal foil 708 with the metalized surface of the wafer 702.

In an embodiment, the force is applied to the metal foil 708 by dragging a chuck or paddle. In this case, a shear force may directly result, as described in association with FIG. 2A. In another embodiment, the force is applied to the metal foil 708 by rolling a roller across a top surface of the metal foil 708. In this case, the roller may not actually apply a shear force to the metal foil 708, but rather may apply a normal force to the foil but a shearing effect occurs as the rolling process is performed along the surface of the metal foil 708, as described in association with FIG. 2B.

In an embodiment, the force is applied from a region of the metal foil aligned with an inner portion of the wafer of the solar cell to a region of the metal foil aligned with an outer portion of the wafer of the solar cell, as described in association with FIG. 4A. In another embodiment, a process such as described in association with FIG. 4B is implemented. In an embodiment, the force is applied to the metal foil 708 while the wafer 702 of the solar cell is heated to a temperature approximately in the range of 350-580 degrees Celsius. In an embodiment, a vacuum is applied to evacuate an interface between the metal foil 708 and the metallized surface of the wafer 702 during the applying of the force. In a specific embodiment, as was described above, the metalized surface of the wafer 702 of the solar cell includes a metal seed layer, and applying the force involves electrically contacting the metal foil 708 to the metal seed layer.

In an embodiment, at the time of joining the metal foil 708 and the substrate 702, the metal foil 708 has a surface area substantially larger than a surface area of the wafer 702 of the solar cell. In one such embodiment, subsequent to electrically contacting the metal foil 708 to the metalized surface of the wafer 702, the metal foil is cut to provide the metal foil 708 having a surface area substantially the same as the surface area of the wafer 702 of the solar cell. In another embodiment, however, prior to placing the metal foil 708 over the metalized surface of the wafer 702 of the solar cell, a large sheet of foil is cut to provide the metal foil 708 having a surface area substantially the same as a surface area of the wafer 702 of the solar cell, as is depicted in FIG. 7A.

In an embodiment, the resulting structures from the process described above in association with flowchart 600 and FIGS. 7A and 7B, followed by 3 and 4A or 4B, are subjected to a contact metallization patterning process. As an example, FIGS. 8A-8C illustrate cross-sectional views of various stages in the fabrication of a solar cell using foil-based metallization, in accordance with an embodiment of the present disclosure.

Referring to FIG. 8A, a plurality of alternating N-type and P-type semiconductor regions are disposed above a substrate. In particular, a substrate 800 has disposed there above N-type semiconductor regions 804 and P-type semiconductor regions 806 disposed on a thin dielectric material 802 as an intervening material between the N-type semiconductor regions 804 or P-type semiconductor regions 806, respectively, and the substrate 800. The substrate 800 has a light-receiving surface 801 opposite a back surface above which the N-type semiconductor regions 804 and P-type semiconductor regions 806 are formed.

In an embodiment, the substrate 800 is a monocrystalline silicon substrate, such as a bulk single crystalline N-type doped silicon substrate. It is to be appreciated, however, that substrate 800 may be a layer, such as a multi-crystalline silicon layer, disposed on a global solar cell substrate. In an embodiment, the thin dielectric layer 802 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 804 and 806, respectively, are formed from polycrystalline silicon formed by, e.g., using a plasma-enhanced chemical vapor deposition (PECVD) process. In one such embodiment, the N-type polycrystalline silicon emitter regions 804 are doped with an N-type impurity, such as phosphorus. The P-type polycrystalline silicon emitter regions 806 are doped with a P-type impurity, such as boron. As is depicted in FIG. 8A, the alternating N-type and P-type semiconductor regions 804 and 806 may have trenches 808 formed there between, the trenches 808 extending partially into the substrate 800. Additionally, in one embodiment, a bottom anti-reflective coating (BARC) material 810 or other protective layer (such as a layer amorphous silicon) is formed on the alternating N-type and P-type semiconductor regions 804 and 806, as is depicted in FIG. 8A.

In an embodiment, the light receiving surface 801 is a texturized light-receiving surface, as is depicted in FIG. 8A. In one embodiment, a hydroxide-based wet etchant is employed to texturize the light receiving surface 801 of the substrate 800 and, possibly, the trench 808 surfaces as is also depicted in FIG. 8A. It is to be appreciated that the timing of the texturizing of the light receiving surface may vary. For example, the texturizing may be performed before or after the formation of the thin dielectric layer 802. In an embodiment, a texturized surface may be one which has a regular or an irregular shaped surface for scattering incoming light, decreasing the amount of light reflected off of the light receiving surface 801 of the solar cell. Referring again to FIG. 8A, additional embodiments can include formation of a passivation and/or anti-reflective coating (ARC) layers (shown collectively as layer 812) on the light-receiving surface 801. It is to be appreciated that the timing of the formation of passivation and/or ARC layers may also vary.

Referring again to FIG. 8A, a plurality of metal seed material regions 814 is formed to provide a metal seed material region on each of the alternating N-type and P-type semiconductor regions 804 and 806, respectively. The metal seed material regions 814 make direct contact to the alternating N-type and P-type semiconductor regions 804 and 806. In an embodiment, the metal seed regions 814 are aluminum regions. In one such embodiment, the aluminum regions each have a thickness approximately in the range of 0.3 to 20 microns and include aluminum in an amount greater than approximately 97% and silicon in an amount approximately in the range of 0-2%. In other embodiments, the metal seed regions 814 include a metal such as, but not limited to, nickel, silver, cobalt or tungsten. Optionally, a protection layer may be included on the plurality of metal seed material regions 814. In a particular embodiment, an insulating layer 816 is formed on the plurality of metal seed material regions 814. In an embodiment, the insulating layer 816 is a silicon nitride or silicon oxynitride material layer. In another embodiment, in place of the metal seed regions 814, a blanket metal seed layer is used that is not patterned at this stage of processing. In that embodiment, the blanket metal seed layer may be patterned in a subsequent etching process, such as a hydroxide-based wet etching process.

Referring again to FIG. 8A, a metal foil 818 is adhered to the alternating N-type and P-type semiconductor regions by directly coupling portions of the metal foil 818 with a corresponding portion of each of the metal seed material regions 814. In one such embodiment, the direct coupling of portions of the metal foil 818 with a corresponding portion of each of the metal seed material regions 814 involves forming a metal weld 820 at each of such locations, as is depicted in FIG. 8A.

In an embodiment, the metal foil 818 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment, the metal foil 818 is adhered directly to the plurality of metal seed material regions 814 by using a technique such as, but not limited to, a thermo-compression bonding process as described above. In an embodiment, the optional insulating layer 816 is included, and adhering the metal foil 818 to the plurality of metal seed material regions 814 involves breaking through regions of the insulating layer 816, as is depicted in FIG. 8A.

It is to be appreciated that, in accordance with another embodiment of the present disclosure, a seedless approach may be implemented. In such an approach, metal seed material regions 814 are not formed, and the metal foil 818 is adhered directly to the material of the alternating N-type and P-type semiconductor regions 804 and 806. For example, in one embodiment, the metal foil 818 is adhered directly to alternating N-type and P-type polycrystalline silicon regions. In either case, process may be described as adhering the metal foil to a metallized surface of a solar cell.

FIG. 8B illustrates the structure of FIG. 8A following formation of laser grooves in the metal foil. Referring to FIG. 8B, the metal foil 818 is laser ablated through only a portion of the metal foil 818 at regions corresponding to locations between the alternating N-type and P-type semiconductor regions 804 and 806, e.g., above trench 808 locations as is depicted in FIG. 8B. The laser ablating forms grooves 830 that extend partially into, but not entirely through, the metal foil 818. In an embodiment, forming laser grooves 830 involves laser ablating a thickness of the metal foil 818 approximately in the range of 80-99% of an entire thickness of the metal foil 818. That is, in one embodiment, it is critical that the lower portion of the metal foil 818 is not penetrated, such that metal foil 818 protects the underlying emitter structures.

Figure 8C:
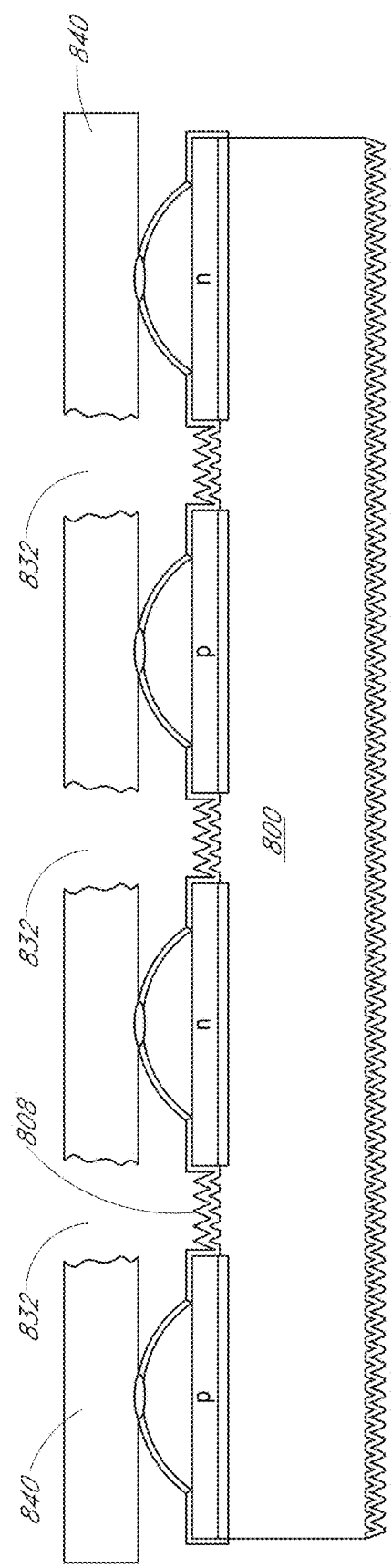

The grooves 830 of FIG. 8B may then be used to isolate conductive regions 840 as metallization structures for the underlying emitter regions. For example, referring to FIG. 8C, the grooves 830 are extended to provide gaps 832 between conductive regions 840. In an embodiment, the patterned metal foil 818 is etched to isolate portions 840 of the metal foil 818. In one such embodiment, the structure of FIG. 8B is exposed to a wet etchant. Although the wet etchant etches all exposed portions of the metal foil 818, a carefully timed etch process is used to break through the bottoms of the laser grooves 830 without significantly reducing the thickness of the non-grooved regions 840 of the metal foil 818, as is depicted in FIG. 8C. In a particular embodiment, a hydroxide based etchant is used, such as, but not limited to, potassium hydroxide (KOH) or tetramethylammonium hydroxide (TMAH).

In another embodiment (not shown), the remaining metal foil 818 of FIG. 8B is subsequently anodized at exposed surfaces thereof to isolate regions 840 of the remaining metal foil 818 corresponding to the alternating N-type and P-type semiconductor regions 804 and 806. In particular, the exposed surfaces of the metal foil 818, including the surfaces of the grooves 830, are anodized to form an oxide coating. At locations corresponding to the alternating N-type and P-type semiconductor regions 804 and 806, e.g., in the grooves 830 at locations above the trenches 808, the entire remaining thickness of the metal foil 818 is anodized there through to isolate regions 840 of metal foil 818 remaining above each of the N-type and P-type semiconductor regions 804 and 806.

Figure 9:
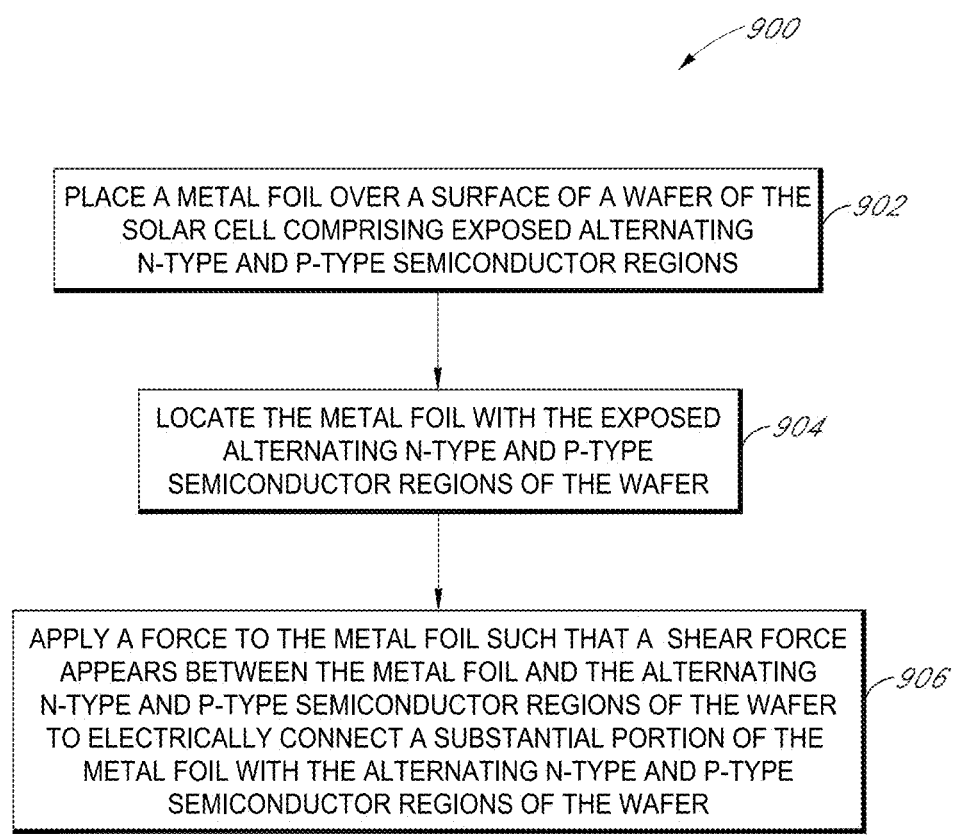
FIG. 9 is a flowchart listing operations in another method of fabricating a solar cell, in accordance with another embodiment of the present disclosure.

In a second aspect, a metal foil and solar cell pairing approach involving thermo-compression bonding is implemented using emitter regions of a wafer of the solar cell. Consistent with the second aspect, FIG. 9 is a flowchart 900 listing operations in another method of fabricating a solar cell, in accordance with another embodiment of the present disclosure.

Referring to operation 902 of flowchart 900, a method of fabricating a solar cell includes placing a metal foil over a surface of a wafer of the solar cell. The surface of the solar cell includes exposed alternating N-type and P-type semiconductor regions (e.g., a monocrystalline silicon or polycrystalline silicon exposed surface, without additional metal thereon). Referring to operation 904 of flowchart 900, the method also includes locating the metal foil with the exposed alternating N-type and P-type semiconductor regions of the wafer. Referring to operation 906 of flowchart 900, the method also includes, subsequent to the locating, applying a force to the metal foil such that a shear force appears between the metal foil and the alternating N-type and P-type semiconductor regions of the wafer to electrically connect a substantial portion of the metal foil with the alternating N-type and P-type semiconductor regions of the wafer.

Figure 10:
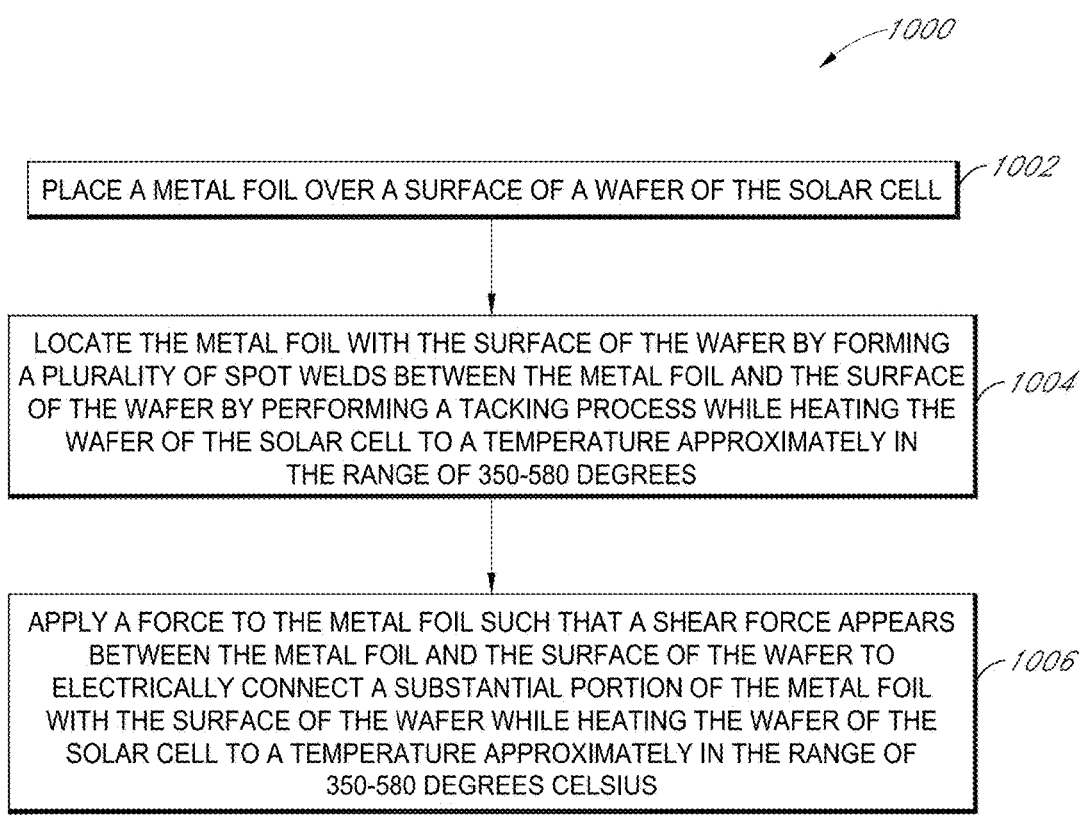
FIG. 10 is a flowchart listing operations in another method of fabricating a solar cell, in accordance with another embodiment of the present disclosure.

In a third aspect, a metal foil and solar cell pairing approach involving thermo-compression bonding is implemented using an exposed surface of a wafer of the solar cell. Consistent with the second aspect, FIG. 10 is a flowchart 1000 listing operations in another method of fabricating a solar cell, in accordance with another embodiment of the present disclosure.

Referring to operation 1002 of flowchart 1000, a method of fabricating a solar cell includes placing a metal foil over a surface of a wafer of the solar cell. Referring to operation 1004 of flowchart 1000, the method also includes locating the metal foil with the surface of the wafer by forming a plurality of spot welds between the metal foil and the surface of the wafer. The plurality of spot welds is formed by performing a tacking process while heating the wafer of the solar cell to a temperature approximately in the range of 350-580 degrees. Referring to operation 1006 of flowchart 1000, the method also includes, subsequent to the locating, applying a force to the metal foil such that a shear force appears between the metal foil and the surface of the wafer. The shear force electrically connects a substantial portion of the metal foil with the surface of the wafer. The force is applied while heating the wafer of the solar cell to a temperature approximately in the range of 350-580 degrees Celsius.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, thermal compression bonding approaches for foil-based metallization of solar cells, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
   placing a metal foil over a metalized surface of a wafer of the solar cell;
   locating the metal foil with the metalized surface of the wafer, wherein locating the metal foil with the metalized surface of the wafer comprises forming a plurality of spot welds between the metal foil with the metalized surface of the wafer by performing a tacking process, and wherein performing the tacking process comprises heating the wafer of the solar cell to a temperature approximately in the range of 350-580 degrees Celsius during the tacking process; and
   subsequent to the locating, applying a force to the metal foil such that a shear force appears between the metal foil and the metallized surface of the wafer to electrically connect at least a portion of the metal foil with the metalized surface of the wafer, wherein applying the force to the metal foil comprises dragging a chuck or paddle or rolling a roller across a top surface of the metal foil.

2. The method of claim 1, wherein performing the tacking process comprises applying a bed of nails or a porcupine roller on the metal foil to form the plurality of spot welds.

3. The method of claim 1, wherein performing the tacking process comprises breaking through portions of one or more metal oxide layers at an interface between the metal foil and the metalized surface to form the plurality of spot welds.

4. The method of claim 1, wherein forming the plurality of spot welds provides channels between the metal foil and the metalized surface for subsequent removal of air from between the metal foil and the metalized surface.

5. The method of claim 1, wherein applying the force to the metal foil comprises dragging the chuck or paddle across the top surface of the metal foil.

6. The method of claim 1, wherein applying the force to the metal foil comprises applying the force from a region of the metal foil aligned with an inner portion of the wafer of the solar cell to a region of the metal foil aligned with an outer portion of the wafer of the solar cell.

7. The method of claim 1, wherein applying the force to the metal foil comprises heating the wafer of the solar cell to a temperature approximately in the range of 350-580 degrees Celsius during the applying the force.

8. The method of claim 1, wherein applying the force to the metal foil comprises applying a vacuum to evacuate an interface between the metal foil and the metallized surface of the wafer during the applying the force.

9. The method of claim 1, wherein the metal foil has a surface area larger than a surface area of the wafer of the solar cell, the method further comprising:
   subsequent to electrically contacting the metal foil to the metalized surface of the wafer, cutting to the metal foil to provide the metal foil having a surface area the same as the surface area of the wafer of the solar cell.

10. The method of claim 1, further comprising:
    prior to placing the metal foil over the metalized surface of the wafer of the solar cell, cutting a large sheet of foil to provide the metal foil having a surface area the same as a surface area of the wafer of the solar cell.

11. The method of claim 1, wherein the metalized surface of the wafer of the solar cell comprises a metal seed layer, and wherein applying the force comprises electrically contacting the metal foil to the metal seed layer.

12. A method of fabricating a solar cell, the method comprising:
    placing a metal foil over a surface of a wafer of the solar cell comprising exposed alternating N-type and P-type semiconductor regions;
    locating the metal foil with the exposed alternating N-type and P-type semiconductor regions of the wafer, wherein locating the metal foil with the exposed alternating N-type and P-type semiconductor regions of the wafer comprises forming a plurality of spot welds between the metal foil with the exposed alternating N-type and P-type semiconductor regions of the wafer by performing a tacking process, and wherein performing the tacking process comprises heating the wafer of the solar cell to a temperature approximately in the range of 350-580 degrees Celsius during the tacking process; and
    subsequent to the locating, applying a force to the metal foil such that a shear force appears between the metal foil and the alternating N-type and P-type semiconductor regions of the wafer to electrically connect at least a portion of the metal foil with the alternating N-type and P-type semiconductor regions of the wafer, wherein applying the force to the metal foil comprises dragging a chuck or paddle or rolling a roller across a top surface of the metal foil.

13. The method of claim 12, wherein performing the tacking process comprises applying a bed of nails or a porcupine roller on the metal foil to form the plurality of spot welds.

14. The method of claim 12, wherein performing the tacking process comprises breaking through portions of an oxide layer at an interface between the metal foil and the exposed alternating N-type and P-type semiconductor regions to form the plurality of spot welds.

15. The method of claim 12, wherein forming the plurality of spot welds provides channels between the metal foil and the exposed alternating N-type and P-type semiconductor regions for subsequent removal of air from between the metal foil and the exposed alternating N-type and P-type semiconductor regions.

16. A method of fabricating a solar cell, the method comprising:
    placing a metal foil over a metalized surface of a wafer of the solar cell;
    locating the metal foil with the metalized surface of the wafer; and
    subsequent to the locating, applying a force to the metal foil such that a shear force appears between the metal foil and the metallized surface of the wafer to electrically connect at least a portion of the metal foil with the metalized surface of the wafer, wherein applying the force to the metal foil comprises dragging a chuck or paddle or rolling a roller across a top surface of the metal foil, and wherein applying the force to the metal foil comprises heating the wafer of the solar cell to a temperature approximately in the range of 350-580 degrees Celsius during the applying the force.

17. The method of claim 16, wherein locating the metal foil with the metalized surface of the wafer comprises forming a plurality of spot welds between the metal foil with the metalized surface of the wafer by performing a tacking process.

18. The method of claim 17, wherein performing the tacking process comprises applying a bed of nails or a porcupine roller on the metal foil to form the plurality of spot welds.

19. The method of claim 16, wherein locating the metal foil with the metalized surface of the wafer comprises forming a plurality of spot welds between the metal foil with the metalized surface of the wafer using a laser welding process.

20. The method of claim 16, wherein applying the force to the metal foil comprises dragging the chuck or paddle across the top surface of the metal foil.

\* \* \* \* \*